(12) United States Patent
Lee et al.

(10) Patent No.: US 9,087,968 B2
(45) Date of Patent: Jul. 21, 2015

(54) WHITE LIGHT EMITTING DEVICE, DISPLAY APPARATUS AND ILLUMINATION APPARATUS

(75) Inventors: Hyo Jin Lee, Seoul (KR); Jeong Hee Kim, Gyeonggi-do (KR); Il Woo Park, Gyeonggi-do (KR); Chang Hoon Kwak, Gyeonggi-do (KR); Kyung Seo, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 726 days.

(21) Appl. No.: 13/458,614

(22) Filed: Apr. 27, 2012

(65) Prior Publication Data

US 2012/0274240 A1 Nov. 1, 2012

(30) Foreign Application Priority Data

Apr. 29, 2011 (KR) .......................... 10-2011-0040478

(51) Int. Cl.

| | |
|---|---|
| *H05B 37/00* | (2006.01) |
| *H01L 33/50* | (2010.01) |
| *H01L 33/00* | (2010.01) |
| *C09K 11/08* | (2006.01) |
| *C09K 11/77* | (2006.01) |
| *H05B 33/14* | (2006.01) |

(52) U.S. Cl.

CPC .......... *H01L 33/504* (2013.01); *C09K 11/0883* (2013.01); *C09K 11/7734* (2013.01); *H01L 33/0095* (2013.01); *H01L 33/502* (2013.01); *H05B 33/14* (2013.01); *Y02B 20/181* (2013.01)

(58) Field of Classification Search

CPC ................. H01L 2924/00; H01L 2924/00014; H01L 2924/0002

See application file for complete search history.

(56) References Cited

U.S. PATENT DOCUMENTS

2009/0250663 A1* 10/2009 Oshio .................... 252/301.4 R

FOREIGN PATENT DOCUMENTS

| | | |
|---|---|---|
| JP | 2008-218998 | 9/2008 |
| JP | 2008-244469 | 10/2008 |
| KR | 10-0777501 | 11/2007 |
| KR | 10-2010-0010922 A | 2/2010 |

* cited by examiner

*Primary Examiner* — Sibin Chen
(74) *Attorney, Agent, or Firm* — McDermott Will & Emery LLP

(57) ABSTRACT

There is provided a white light emitting device including: a blue LED emitting blue light; a red phosphor excited by the blue light, emitting red light, and including a nitrogen (N)-containing compound; a yellow phosphor excited by the blue light and emitting yellow light; a first green phosphor excited by the blue light, emitting first green light having a first full width half maximum, and including a nitrogen (N)-containing compound; and a second green phosphor excited by the blue light and emitting second green light having a second full width half maximum larger than the first full width half maximum of the first green phosphor.

23 Claims, 8 Drawing Sheets

Green1+2

LED SPECTRUM

WHITE LIGHT EMITTING DEVICE, DISPLAY APPARATUS AND ILLUMINATION APPARATUS

CROSS-REFERENCE TO RELATED APPLICATIONS

This application claims the priority of Korean Patent Application No. 10-2011-0040478 filed on Apr. 29, 2011, in the Korean Intellectual Property Office, the disclosure of which is incorporated herein by reference.

BACKGROUND OF THE INVENTION

1. Field of the Invention

The present invention relates to a white light emitting device emitting white light having excellent characteristics, and a display apparatus and an illumination apparatus using the same.

2. Description of the Related Art

In general, a wavelength conversion phosphor material is used to convert a particular wavelength of light from various light sources into a desired wavelength of light. In particular, a light emitting diode (LED), among various light sources, is able to be driven with low power consumption and has excellent light efficiency so it may be advantageously applied to an LED backlight, a vehicle lighting apparatus, and a home lighting apparatus. Recently, a phosphor material has been recognized as a core technology in the manufacturing of a white light emitting device.

In general, a white light emitting device is manufactured by applying one or more types of phosphor (e.g. red, yellow, or green phosphors) to a blue or an ultraviolet LED chip. In particular, in order to obtain desired natural white light, two or more phosphors, rather than a single phosphor (e.g. a yellow phosphor), may be mixed. For example, a red phosphor and one or more other phosphors may be mixed. In this case, if a full-width half-maximum (FWHM) of each of the phosphors is low, a sufficient color rendering index cannot be secured and there will be a limitation in implementing desired natural white light. The requirement of color rendering may be a critical evaluation item in employing the white light emitting device as a light source for illumination.

A silicate-based phosphor, which is generally advantageous in terms of FWHM characteristics, has relatively low thermal stability as compared with other phosphors, so it is not suitable for a phosphor of an LED device used in high temperature conditions. In particular, in the case of a blue LED chip, since a large amount of heat is generated therein, the use of a silicate-based phosphor having low thermal stability may be considerably problematic.

An nitrogen (N)-containing compound phosphor, such as a nitride-based phosphor, has relatively high thermal stability, but has a relatively low FWHM, and accordingly, the color reproducibility thereof may be low and desired color rendering properties may not be secured.

SUMMARY OF THE INVENTION

An aspect of the present invention provides a white light emitting device having a mixture of phosphors allowing for excellent color reproducibility and high color rendering properties while securing thermal stability.

An aspect of the present invention also provides a display apparatus and an illumination apparatus using the white light emitting device.

According to an aspect of the present invention, there is provided a white light emitting device including: a blue LED emitting blue light; a red phosphor excited by the blue light, emitting red light, and including a nitrogen (N)-containing compound; a yellow phosphor excited by the blue light and emitting yellow light; a first green phosphor excited by the blue light, emitting first green light having a first full width half maximum, and including a nitrogen (N)-containing compound; and a second green phosphor excited by the blue light and emitting second green light having a second full width half maximum larger than the first full width half maximum of the first green phosphor, wherein the blue light, the red light, the yellow light, the first green light and the second green light are combined to provide white light having a color coordinate falling within a region defined by four coordinate points (0.21, 0.21), (0.25, 0.17), (0.33, 0.30) and (0.33, 0.35) based on the CIE 1931 chromaticity diagram.

The first green light may have a color coordinate falling within a region defined by four coordinate points (0.370, 0.590), (0.370, 0.620), (0.300, 0.690) and (0.300, 0.660) based on the CIE 1931 chromaticity diagram, and the second green light may have a color coordinate falling within a region defined by four coordinate points (0.420, 0.565), (0.420, 0.525), (0.300, 0.560) and (0.300, 0.620) based on the CIE 1931 chromaticity diagram.

The yellow light may have a color coordinate falling within a region defined by four coordinate points (0.420, 0.580), (0.470, 0.530), (0.470, 0.500) and (0.420, 0.550) based on the CIE 1931 chromaticity diagram.

The red light may have a color coordinate falling within a region defined by four coordinate points (0.600, 0.400), (0.670, 0.330), (0.670, 0.310) and (0.600, 0.380) based on the CIE 1931 chromaticity diagram.

The blue light may be within a dominant wavelength ranging from 435 nm to 465 nm. The first green light may have a peak wavelength of 520 nm to 545 nm and the first full width half maximum of 70 nm or less, and the second green light may have a peak wavelength of 525 nm to 565 nm.

The red light may have a peak wavelength of 600 nm to 650 nm. The yellow light may have a peak wavelength of 550 nm to 580 nm larger than the peak wavelength of the second green light.

A light emission spectrum of the white light may have an emission peak outside of a blue light wavelength band, and the emission peak may have a full width half maximum of 90 nm or larger, and more preferably, 100 nm or larger. Further, the white light may represent a color reproducibility of 69% or greater based on the NTSC standard.

The first green phosphor may include β-SiAlON:Eu, and the second green phosphor may include $L_3M_5O_{12}$:Ce, where L may be at least one of Lu, Yb and Tb and M may be at least one of Al and Ga.

The red phosphor may be at least one of $AAlSiN_x$:Eu ($1 \leq x \leq 5$) and $A_2Si_5N_8$:Eu, where A may be at least one of Ba, Sr, Ca and Mg. The yellow phosphor may be at least one of $ASiO_4$:Eu and $A_2Si_2O_2N_2$:Eu, where A may be at least one of Ba, Sr, Ca and Mg.

According to another aspect of the present invention, there is provided a white light emitting device including: a blue LED emitting blue light having a dominant wavelength ranging from 435 nm to 465 nm; a red phosphor excited by the blue light and emitting red light having a peak wavelength of 600 nm to 650 nm; a yellow phosphor excited by the blue light and emitting yellow light having a peak wavelength of 550 nm to 580 nm; a first green phosphor excited by the blue light, emitting first green light having a first peak wavelength of 520 nm to 545 nm and a first full width half maximum of 70 nm or less; and a second green phosphor excited by the blue light and emitting second green light having a second peak wavelength of 525 nm to 565 nm and a second full width half maximum larger than the first full width half maximum, wherein the blue light, the red light, the yellow light, the first green light and the second green light are combined to provide white light having a color coordinate falling within a region defined by four coordinate points (0.21, 0.21), (0.25, 0.17), (0.33, 0.30) and (0.33, 0.35) based on the CIE 1931 chromaticity diagram.

The peak wavelength of the second green light may be less than the peak wavelength of the yellow light. The first and second green light may have the same or similar peak wavelength, but may have different full width half maximum.

A light emission spectrum of the white light may have an emission peak outside of a blue light wavelength band, and the emission peak may have a full width half maximum of 90 nm or larger.

The first green phosphor may include β-SiAlON:Eu, and the second green phosphor may include $L_3M_5O_{12}$:Ce, where L may be at least one of Lu, Yb and Tb and M may be at least one of Al and Ga.

The red phosphor may be at least one of $AAlSiN_x$: Eu ($1 \leq x \leq 5$) and $A_2Si_5N_8$:Eu, where A may be at least one of Ba, Sr, Ca and Mg. The yellow phosphor may be at least one of $ASiO_4$:Eu and $A_2Si_2O_2N_2$:Eu, where A may be at least one of Ba, Sr, Ca and Mg.

According to another aspect of the present invention, there is provided a phosphor mixture having a plurality of phosphors excited by blue light having a dominant wavelength ranging from 435 nm to 465 nm, the phosphor mixture including: a red phosphor excited by the blue light, emitting red light, and including a nitride; a yellow phosphor excited by the blue light and emitting yellow light; a first green phosphor excited by the blue light, emitting first green light having a first full width half maximum, and including a nitride; and a second green phosphor excited by the blue light and emitting second green light having a second full width half maximum larger than the first full width half maximum, wherein the blue light, the red light, the yellow light, the first green light and the second green light are combined to provide white light having a color coordinate falling within a region defined by four coordinate points (0.21, 0.21), (0.25, 0.17), (0.33, 0.30) and (0.33, 0.35) based on the CIE 1931 chromaticity diagram.

According to another aspect of the present invention, there is provided a display apparatus including: an LED light source module; and an image display panel allowing for irradiation of light from the LED light source module and displaying an image, wherein the LED light source module includes a circuit board and the at least one white light emitting device mounted on the circuit board.

According to another aspect of the present invention, there is provided an illumination apparatus including: an LED light source module; and a diffusion part disposed on an upper portion of the LED light source module and uniformly diffusing light incident from the LED light source module, wherein the LED light source module includes a circuit board and the at least one white light emitting device mounted on the circuit board.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

A white light emitting device according to an embodiment of the invention includes a blue light emitting diode (LED) and red, yellow and green phosphors for conversion of blue light emitted from the blue LED. The green phosphor includes a first green phosphor emitting first green light and a second green phosphor having a full width at half maximum (FWHM) larger than that of the first green phosphor and emitting second green light.

Since the blue LED employed in the embodiment of the invention emits a relatively large amount of heat, at least a portion of a mixture of the phosphors may utilize a nitrogen (N)-containing compound having excellent thermal stability such as a nitride-based phosphor or an oxynitride-based phosphor.

Such a nitrogen (N)-containing compound has high thermal stability, but it has a small FWHM, resulting in a reduction of a color rendering index. Accordingly, the first green phosphor may utilize an N-containing compound, and the second green phosphor having a FWHM larger than that of the first green phosphor and emitting second green light may be supplementary thereto.

Figure 3:
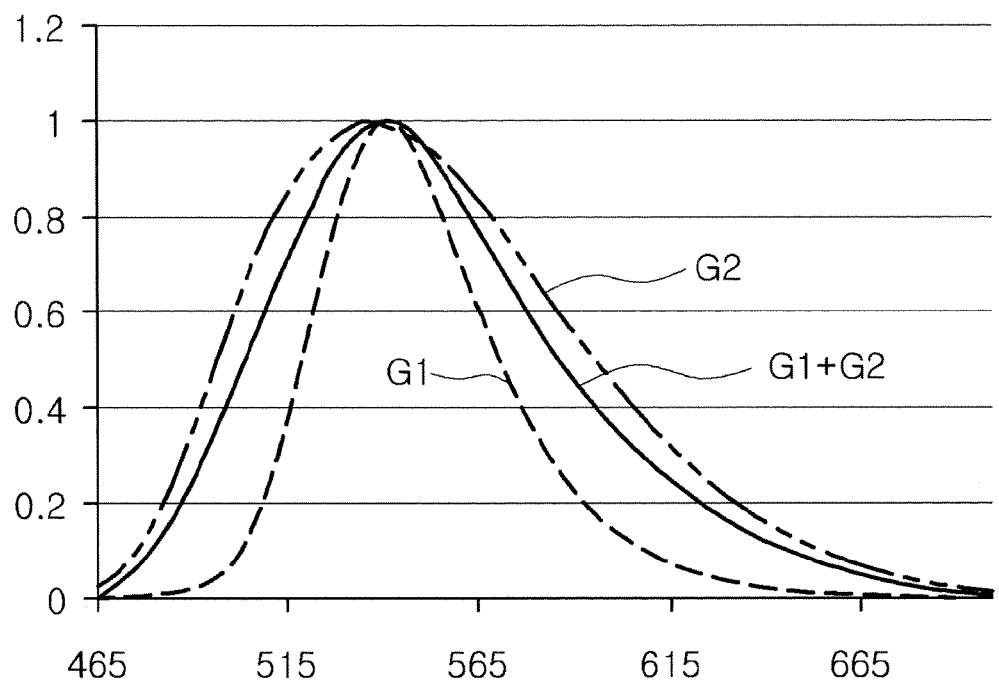
FIG. 3 shows light emission spectra of first and second green phosphors according to an embodiment of the present invention.

The second green phosphor may have a peak wavelength equal to or similar to that of the first green phosphor, but may have a FWHM larger than that of the first green phosphor. The narrow FWHM of the first green phosphor is supplemented by the relatively large FWHM of the second green phosphor, whereby a FWHM in a green wavelength region of a light emission spectrum can be increased (see FIG. 3).

Together with light emitted from the first and second green phosphors employed in the embodiment of the invention, light emitted from the red and yellow phosphors and light emitted from the blue LED are mixed to thereby provide white light. Here, as shown in FIG. 1, white light may have a color coordinate falling within a region TG defined by four coordinate points (0.21, 0.21), (0.25, 0.17), (0.33, 0.30) and (0.33, 0.35) based on the CIE 1931 chromaticity diagram.

Figure 1:
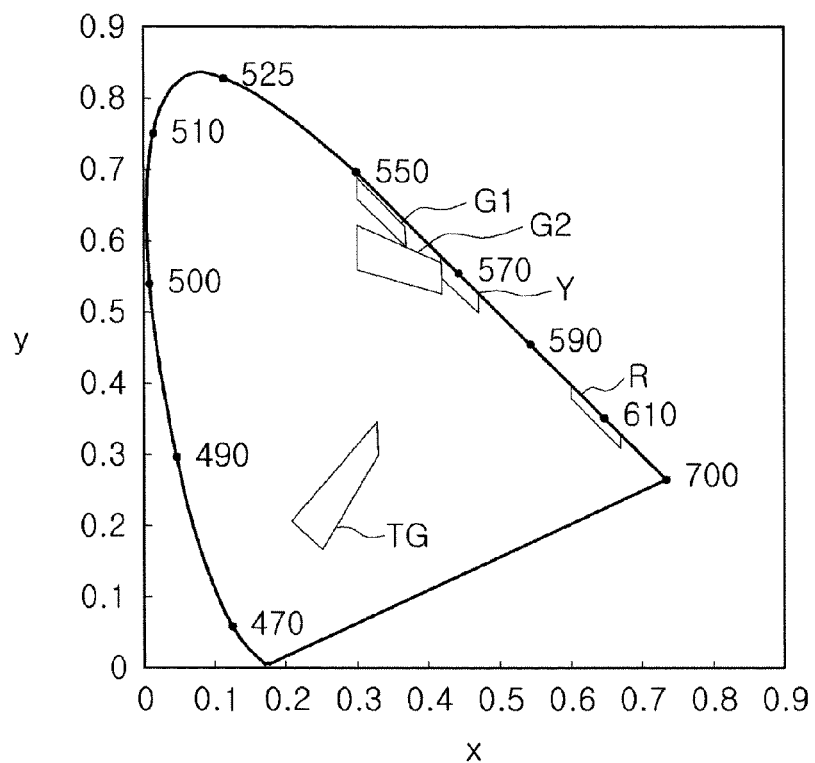
FIG. 1 shows the CIE 1931 chromaticity diagram showing the color coordinates of applicable phosphors and target white light according to an embodiment of the present invention.

The red, yellow, and first and second green phosphors may be mixed in an appropriate ratio so as to satisfy conditions necessary for producing desired white light falling within the color coordinate region TG as shown in FIG. 1, and may be applied to the blue LED.

As shown in the CIE 1931 chromaticity diagram of FIG. 1, there may be a desired color coordinate region for each color capable of providing excellent color reproducibility and color rendering properties while satisfying the condition that desired white light be within the color coordinate region TG.

First green light G1 emitted from the first green phosphor may have a color coordinate falling within a region defined by four coordinate points (0.370, 0.590), (0.370, 0.620), (0.300, 0.690) and (0.300, 0.660) based on the CIE 1931 chromaticity diagram. Second green light G2 emitted from the second green phosphor may have a color coordinate falling within a region defined by four coordinate points (0.420, 0.565), (0.420, 0.525), (0.300, 0.560) and (0.300, 0.620) based on the CIE 1931 chromaticity diagram.

Yellow light Y emitted from the yellow phosphor may have a color coordinate falling within a region defined by four coordinate points (0.420, 0.580), (0.470, 0.530), (0.470, 0.500) and (0.420, 0.550) based on the CIE 1931 chromaticity diagram. Red light R emitted from the red phosphor may have a color coordinate falling within a region defined by four coordinate points (0.600, 0.400), (0.670, 0.330), (0.670, 0.310) and (0.600, 0.380) based on the CIE 1931 chromaticity diagram.

The blue light of the blue LED may be within a dominant wavelength ranging from 435 nm to 465 nm.

The first green light emitted from the first green phosphor may have a peak wavelength of 520 nm to 545 nm and a first FWHM of 70 nm or less. The second green phosphor, emitting the second green light having a peak wavelength of 525 nm to 565 nm while having a second FWHM larger than the first FWHM, may be additionally employed to thereby enhance color rendering and color reproducibility properties.

The red light emitted from the red phosphor may have a peak wavelength of 600 nm to 650 nm. The yellow light emitted from the yellow phosphor may have a peak wavelength of 550 nm to 580 nm larger than the peak wavelength of the second green light.

The light emission spectrum of white light obtained by using the red and yellow phosphors together with the first and second green phosphors based on the above-mentioned conditions has an emission peak outside of a blue light wavelength band. The emission peak may have a FWHM of 90 nm or larger, and more preferably, 100 nm or larger. Further, the white light obtained based on the above-mentioned conditions may represent a color reproducibility of 69% or greater based on the National Television System Committee (NTSC) standard.

The first green phosphor satisfying the above-mentioned conditions may be an oxynitride phosphor including β-SiAlON:Eu. The second green phosphor may include $L_3M_5O_{12}$:Ce, where L may be at least one of Lu, Yb and Tb and M may be at least one of Al and Ga.

The red phosphor may be at least one of $AAlSiN_x$:Eu ($1 \leq x \leq 5$) and $A_2Si_5N_8$:Eu, and the yellow phosphor may be at least one of $ASiO_4$:Eu and $A_2Si_2O_2N_2$:Eu, where A may be at least one of Ba, Sr, Ca and Mg.

According to another embodiment of the invention, the conditions of phosphors may be specified based on a peak wavelength and/or a FWHM of light emitted from individual phosphors.

That is, in a case in which a blue LED emitting blue light having a dominant wavelength of 435 nm to 465 nm is used, a red phosphor emitting red light having a peak wavelength of 600 nm to 650 nm and a yellow phosphor emitting yellow light having a peak wavelength of 550 nm to 580 nm may be used.

Further, the first and second green phosphors are included while satisfying the following conditions: the first green phosphor emits the first green light having a peak wavelength of 520 nm to 545 nm and a FWHM of 70 nm or less, and the second green phosphor emits the second green light excited by the blue light and having a peak wavelength of 525 nm to 580 nm less than the peak wavelength of the yellow light.

The four phosphors, i.e., the red, yellow, and first and second green phosphors may be mixed in an appropriate ratio so as to allow white light obtained when mixed with the blue light from the blue LED to have a color coordinate falling within a region defined by four coordinate points (0.21, 0.21), (0.25, 0.17), (0.33, 0.30) and (0.33, 0.35) based on the CIE 1931 chromaticity diagram.

The operations and effects of the present invention will be described in greater detail with reference to the following examples:

Example 1

Figure 6:
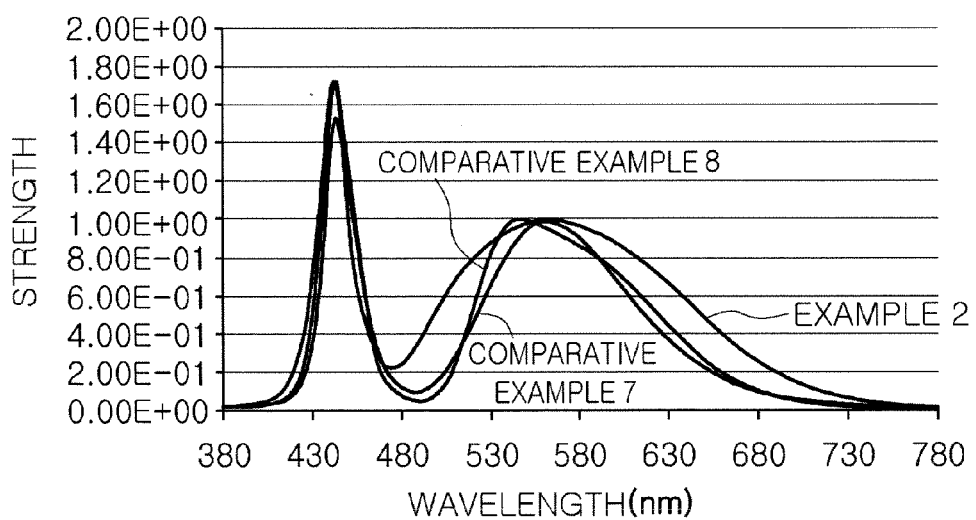
FIG. 6 shows light emission spectra of white light emitting devices according to example 1 and comparative examples 7 and 8.

Four phosphors, satisfying the above-described conditions according to the present invention, were mixed to prepare a phosphor mixture. The phosphor mixture was applied to a blue LED having a dominant wavelength of 455 nm, and accordingly, a white light emitting device was prepared to have a light emission spectrum as shown in FIG. 6.

In the present embodiment, (Sr, Ca)$AlSiN_3$:Eu, $CaSiO_4$:Eu, β-SiAlON:Eu, and $Lu_3M_5O_{12}$:Ce were used as the red, yellow, first and second green phosphors, respectively.

Figure 2:
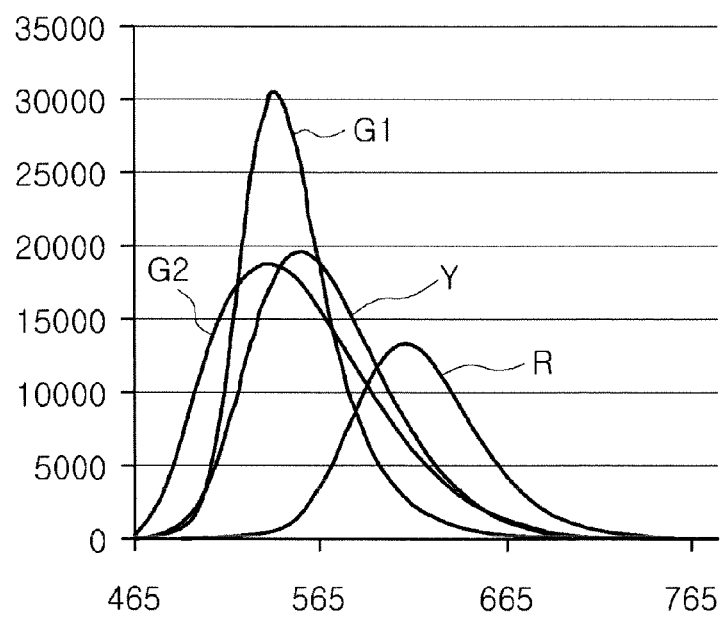
FIG. 2 shows light emission spectra of individual phosphors according to an embodiment of the present invention.

The spectra of the individual phosphors employed in the present embodiment are shown in FIG. 2. The red, yellow, first and second green phosphors employed in the present embodiment refer to R, Y, G1 and G2, respectively.

As shown in FIG. 2, β-SiAlON:Eu, which is an oxynitride-based phosphor, has superior thermal stability, but has a very small FWHM of approximately 52 nm. The other green phosphor $Lu_3M_5O_{12}$:Ce has a relatively large FWHM of approximately 98 nm.

The phosphor mixture was prepared by mixing (Sr, Ca)$AlSiN_3$:Eu, $CaSiO_4$:Eu, β-SiAlON:Eu, and $Lu_3M_5O_{12}$:Ce in the ratio of 8 wt %, 23 wt %, 30 wt %, and 39 wt %, respectively.

Figure 4:
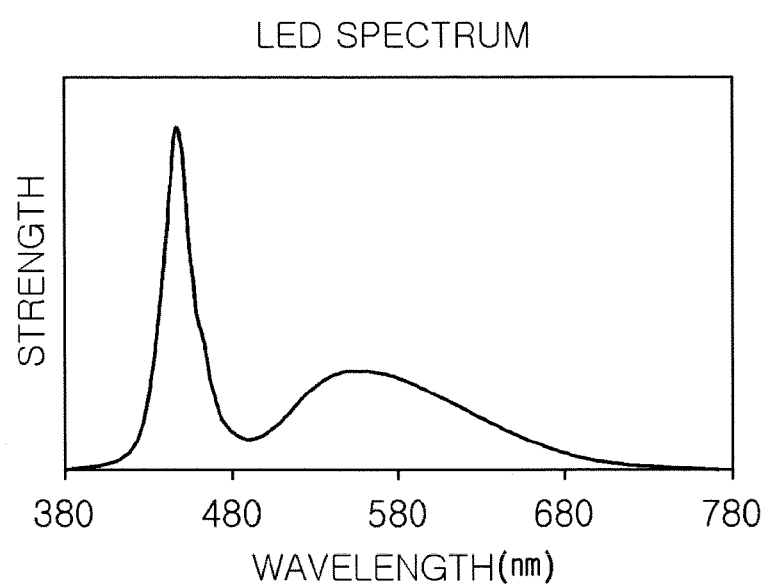
FIG. 4 shows a light emission spectrum of a white light emitting device according to an embodiment of the present invention.

The light emission spectrum of the white light emitting device according to this embodiment was measured and is depicted in FIG. 4. As shown in FIG. 4, a FWHM of a peak region outside of a blue peak region was broadly represented as being 150 nm or larger. This may be understood in that, in order to supplement the small FWHM of the first green phosphor G1 employed for high thermal stability, the second green phosphor G2 having a relatively large FWHM was additionally employed to thereby achieve improved light quality in a green region of the light emission spectrum. Specifically, as shown in the light emission spectra of FIG. 3, the mixture of the first green phosphor G1 and the second green phosphor G2 may contribute to an increase of the FWHM, thereby improving color rendering properties.

In conclusion, although the white light emitting device has alight emission spectrum similar to that obtained in a case in which a silicate-based yellow phosphor having very low thermal stability is used, relatively high thermal stability may be expected therefrom.

Examples 2 to 4 and Comparative Examples 1 to 6

White light emitting devices were manufactured under the same conditions as those of example 1. However, phosphor types used and mixture ratios were set differently as described in table 1 below.

TABLE 1

|  | Red Phosphor | | First Green Phosphor | Second Green Phosphor | Yellow Phosphor | |
| --- | --- | --- | --- | --- | --- | --- |
|  | $(Sr, Ca)AlSiN_3$:Eu | $(Sr, Ca)Si_5N_8$:Eu | β-SiAlON:Eu | $Lu_3M_5O_{12}$:Ce | $CaSiO_4$:Eu | $Ca_2Si_2O_2N_2$:Eu |
| Example 2 | 9 wt % | — | 20 wt % | 34 wt % | 37 wt % | — |
| Example 3 | — | 6 wt % | 15 wt % | 40 wt % | — | 39 wt % |
| Example 4 | 10 wt % | — | 30 wt % | 20 wt % | 40 wt % | — |
| Comparative Example 1 | 6 wt % | — | 30 wt % | 40 wt % | 24 wt % | — |
| Comparative Example 2 | 10 wt % | — | 15 wt % | 40 wt % | 35 wt % | — |
| Comparative Example 3 | — | 10 wt % | 30 wt % | 40 wt % | — | 20 wt % |
| Comparative Example 4 | — | 6 wt % | 15 wt % | 20 wt % | — | 59 wt % |
| Comparative Example 5 | 6 wt % | — | 30 wt % | 20 wt % | 44 wt % | — |
| Comparative Example 6 | 10 wt % | — | 15 wt % | 20 wt % | 55 wt % | — |

Figure 5:
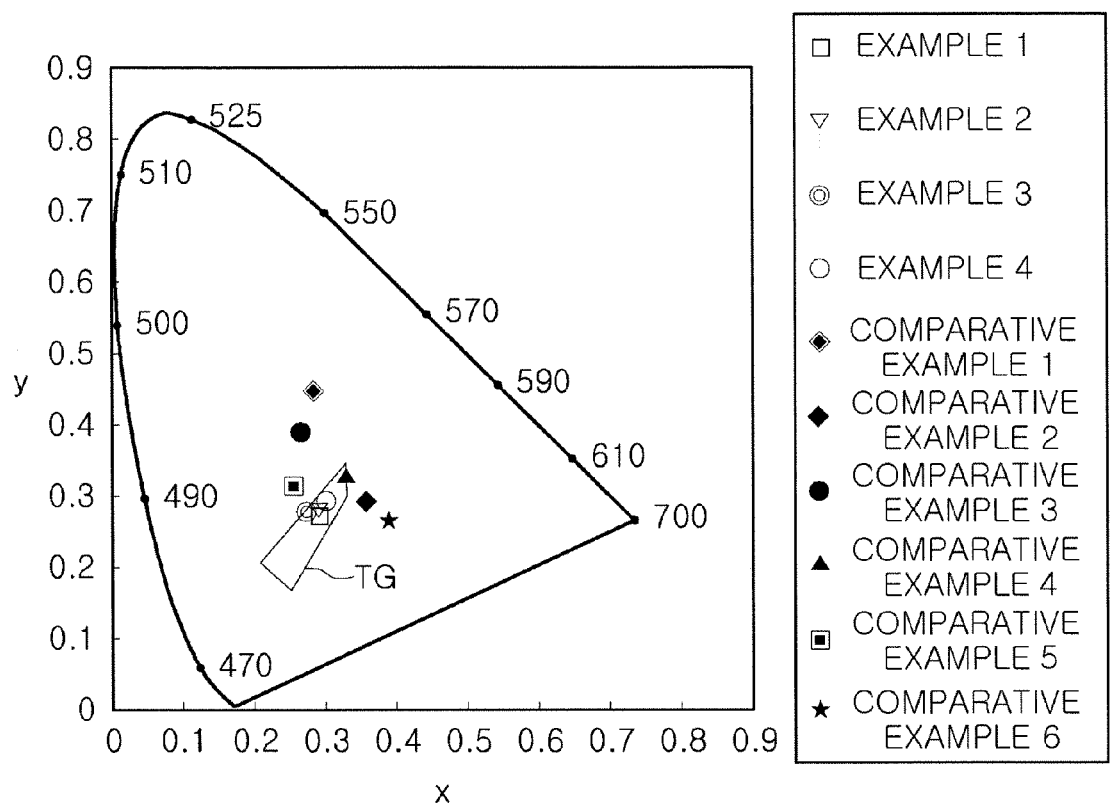
FIG. 5 shows the CIE 1931 chromaticity diagram showing the color coordinates of white light emitting devices according to inventive and comparative examples.

The color coordinates and color reproducibility with respect to the individual white light emitting devices according to the above-identified examples and comparative examples, which were manufactured as set out in table 1, were measured and the results thereof are represented in table 2 below. Further, in order to determine whether white light of the individual white light emitting devices satisfies desired color coordinate conditions, the respective white light color coordinates are depicted in FIG. 5.

TABLE 2

|  | Color Coordinates | | Color Reproducibility |
| --- | --- | --- | --- |
|  | x | y | (NTSC) |
| Example 1 | 0.291 | 0.278 | 71 |
| Example 2 | 0.293 | 0.284 | 72 |
| Example 3 | 0.276 | 0.279 | 72 |
| Example 4 | 0.301 | 0.294 | 70 |
| Comparative Example 1 | 0.285 | 0.450 | 60 |
| Comparative Example 2 | 0.361 | 0.294 | 64 |
| Comparative Example 3 | 0.269 | 0.392 | 63 |
| Comparative Example 4 | 0.331 | 0.328 | 66 |
| Comparative Example 5 | 0.258 | 0.317 | 66 |
| Comparative Example 6 | 0.390 | 0.267 | 65 |

The red and yellow phosphors together with the first and second green phosphors satisfying the conditions of the present invention were selected and used in the same or similar manner. However, according to mixture ratios, the white light obtained in examples 1 to 4 fell within a region having desired color coordinates, while the white light obtained in comparative examples 1 to 6 was outside of a region having desired color coordinates.

Meanwhile, the white light emitting devices according to examples 1 to 4 had a color reproducibility of 69% or greater based on the NTSC standard, while the white light emitting devices according to comparative examples 1 to 6 had a relatively low color reproducibility of 60% to 66% based on the NTSC standard.

In addition, the white light emitting device having a mixture ratio of phosphors under the conditions of the present invention is superior in terms of color rendering properties, and accordingly, it may provide desired natural white light. In order to confirm the color rendering improvement, white light emitting devices according to the related art were manufactured under conditions as stated in comparative examples 7 and 8 below.

Comparative Examples 7 and 8

White light emitting devices were manufactured under the same conditions as those of example 1. However, phosphor types used were set differently.

In the case of comparative example 7, only a silicate-based yellow phosphor of $CaSiO_4$:Eu together with a blue LED having a dominant wavelength of 455 nm was used.

In the case of comparative example 8, a mixture of red and green phosphors together with a blue LED having a dominant wavelength of 455 nm was used. Here, $(Sr, Ca)Si_5N_8$:Eu and β-SiAlON:Eu were selected as the red and green phosphors, respectively.

The light emission spectra of the individual white light emitting devices according to example 1 and comparative examples 7 and 8 are depicted in FIG. 6 and the color rendering properties thereof were evaluated. With reference to FIG. 6, in comparing the spectrum of example 1 with the spectra of comparative examples 7 and 8, a relative strength was increased in a green wavelength region of 480 nm to 520 nm and a red wavelength region of 600 nm to 650 nm. As a result, it has been confirmed that the color rendering index in comparative examples 7 and 8 were 58 and 62, respectively, while the color rendering index in example 1 was greatly increased to 73.

Hereinafter, various applications including phosphors according to embodiments of the invention will be described with reference to the accompanying drawings.

Figure 7:
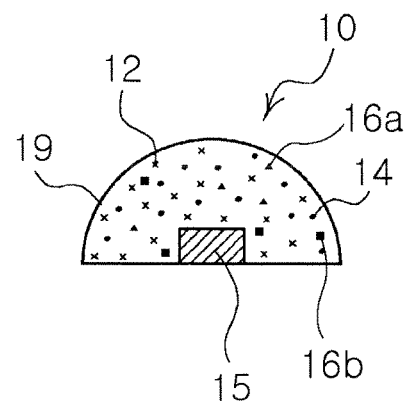
FIGS. 7 through 10 are schematic views of white light emitting devices according to embodiments of the present invention.

FIG. 7 is a schematic view of a white light emitting device according to an embodiment of the present invention.

As shown in FIG. 7, a white light emitting device 10 according to this embodiment includes a blue LED chip 15 and a resin packaging part 19 encapsulating the blue LED chip 15 and having an upwardly convex lens shape.

The resin packaging part 19 according to the present embodiment is illustrated as having a hemispherical lens shape to secure a large orientation angle. The blue LED chip 15 may be directly mounted on a circuit board. The resin packaging part 19 may be made of a silicon resin, an epoxy resin, or a combination thereof. First and second green phosphors 16a and 16b together with a red phosphor 12 and a yellow phosphor 14 are dispersed in the interior of the resin packaging part 19.

The first green phosphor 16a may include an oxynitride phosphor expressed by β-SiAlON:Eu, and the second green phosphor 16b may include $L_3M_5O_{12}$:Ce, where L may be at least one of Lu, Yb and Tb, and M may be at least one of Al and Ga. The red phosphor 12 may be at least one of $AAlSiN_x$:Eu ($1 \leq x \leq 5$) and $A_2Si_5N_8$:Eu, and the yellow phosphor 14 may be at least one of $ASiO_4$:Eu and $A_2Si_2O_2N_2$:Eu, where A may be at least one of Ba, Sr, Ca and Mg.

These four phosphors may be mixed in an appropriate ratio so as to allow white light obtained when mixed with the blue light to have a color coordinate falling within a region defined by four coordinate points (0.21, 0.21), (0.25, 0.17), (0.33, 0.30) and (0.33, 0.35) based on the CIE 1931 chromaticity diagram.

In this manner, since a particular green phosphor and a particular red phosphor are provided as a combination in consideration of the FWHM, the peak wavelength and/or the conversion efficiency, whereby white light having a high color rendering index of 70 or greater may be provided. Also, a plurality of phosphors provide light of various wavelength bands, thereby allowing for improved color reproducibility, preferably, a color reproducibility of 69% or greater based on the NTSC standard.

Figure 8:
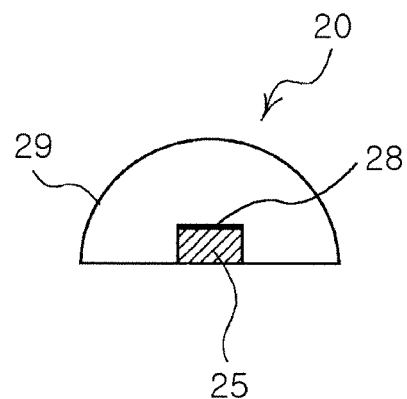

Similar to the previous embodiment, a white light emitting device 20 shown in FIG. 8 includes a blue LED chip 25 and a resin packaging part 29 encapsulating the blue LED chip 25 and having an upwardly convex lens shape. Further, a wavelength conversion part 28 is provided directly on an upper surface of the blue LED chip 25. The wavelength conversion part 28 is also formed of a mixture of red, yellow, and first and second green phosphors.

Figure 9:
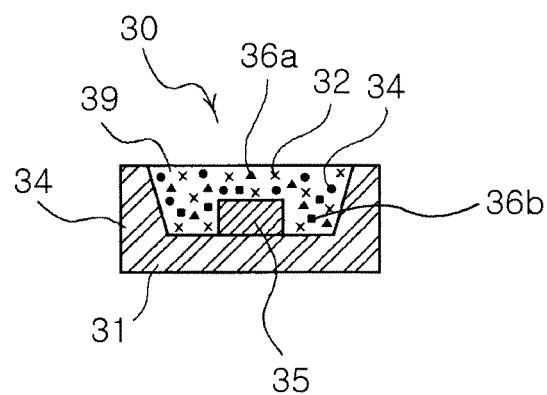

A white light emitting device 30 shown in FIG. 9 includes a package main body 31 having a reflective cup formed at the center thereof, a blue LED chip 35 mounted on the bottom of the reflective cup, and a transparent resin packaging part 39 encapsulating the blue LED chip 35 within the reflective cup.

The resin packaging part 39 may be made of, for example, a silicon resin, an epoxy resin, or a combination thereof. In the present embodiment, first and second green phosphors 36a and 36b, together with a red phosphor 32 and a yellow phosphor 34, may be dispersed in the interior of the resin packaging part 39.

In the embodiments of FIGS. 7 through 9, four types of phosphor powder are mixed to be dispersed in a single resin packaging part area, but various other structures may be implemented. At least one phosphor may be separately provided in another layer structure.

Figure 10:
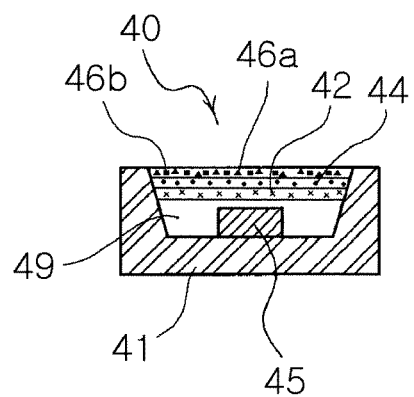

Similar to the previous embodiment, a white light emitting device 40 shown in FIG. 10 includes a package main body 41 having a reflective cup formed at the center thereof, a blue LED chip 45 mounted on the bottom of the reflective cup, and a transparent resin packaging part 49 encapsulating the blue LED chip 45 within the reflective cup.

A resin layer including different phosphor layers is provided on the resin packaging part 49. Namely, a wavelength conversion part may include a first resin layer containing a red phosphor 42, a second resin layer containing a yellow phosphor 44, and a third resin layer containing first and second green phosphors 46a and 46b.

White light obtained by mixing the phosphors proposed in the present embodiment can have a high color rendering index.

Figure 11A:
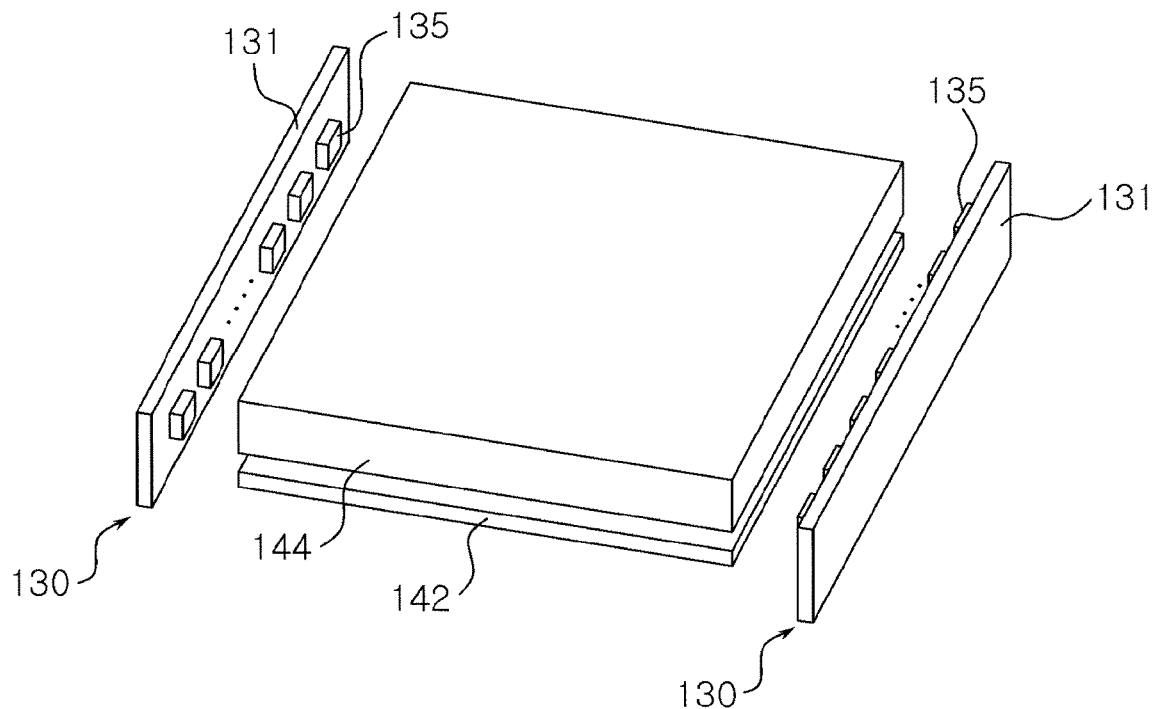
FIGS. 11A and 11B show various types of backlight units applicable to a display apparatus according to an embodiment of the present invention.
Figure 11B:
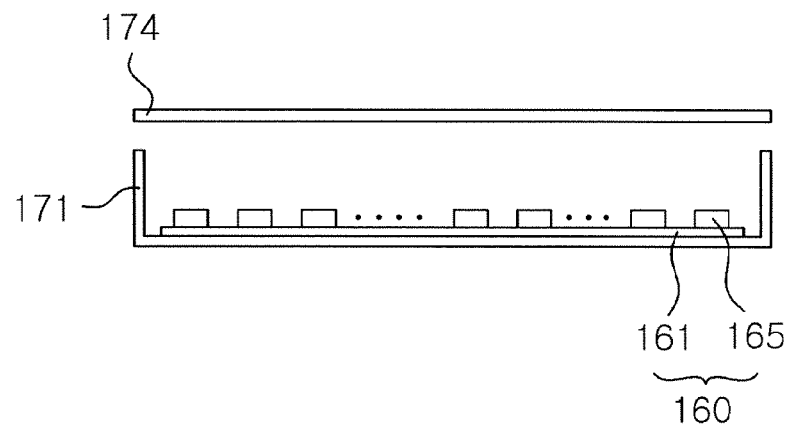

FIGS. 11A and 11B illustrate a backlight unit applicable to a display apparatus according to an embodiment of the present invention.

With reference to FIG. 11A, an edge type backlight unit 150 is illustrated as an example of a backlight unit to which a white light emitting device according to an embodiment of the present invention can be applicable as a light source.

The edge type backlight unit 150 according to this embodiment may include a light guide plate 144 and an LED light source module 130 provided on both sides of the light guide plate 144.

In the present embodiment, the LED light source module 130 is provided on both sides of the light guide plate 144 opposed to each other, but the LED light source module 130 may be provided only to one side, or alternatively, an additional LED light source module may be provided to the other side.

As shown in FIG. 11A, a reflective plate 142 may be additionally provided under the light guide plate 144. The LED light source module 130 employed in the present embodiment includes a printed circuit board (PCB) 131 and a plurality of LED light sources 135 mounted on an upper surface of the PCB 131, and the white light emitting device using the foregoing mixture of phosphors may be adopted as the LED light source 135.

With reference to FIG. 11B, a direct type backlight unit 180 is illustrated as an example of a different type of backlight unit.

The direct type backlight unit 180 according to the present embodiment may include a light diffusion plate 174 and an LED light source module 160 arranged on a lower surface of the light diffusion plate 174.

The backlight unit 180 illustrated in FIG. 11b may further include a bottom case 171 for accommodating the light source module on a lower portion of the light diffusion plate 174.

The LED light source module 160 employed in the present embodiment includes a PCB 161 and a plurality of LED light sources 165 mounted on an upper surface of the PCB 161. The plurality of LED light sources may be white light emitting devices using the foregoing mixture of phosphors as wavelength conversion materials.

Figure 12:
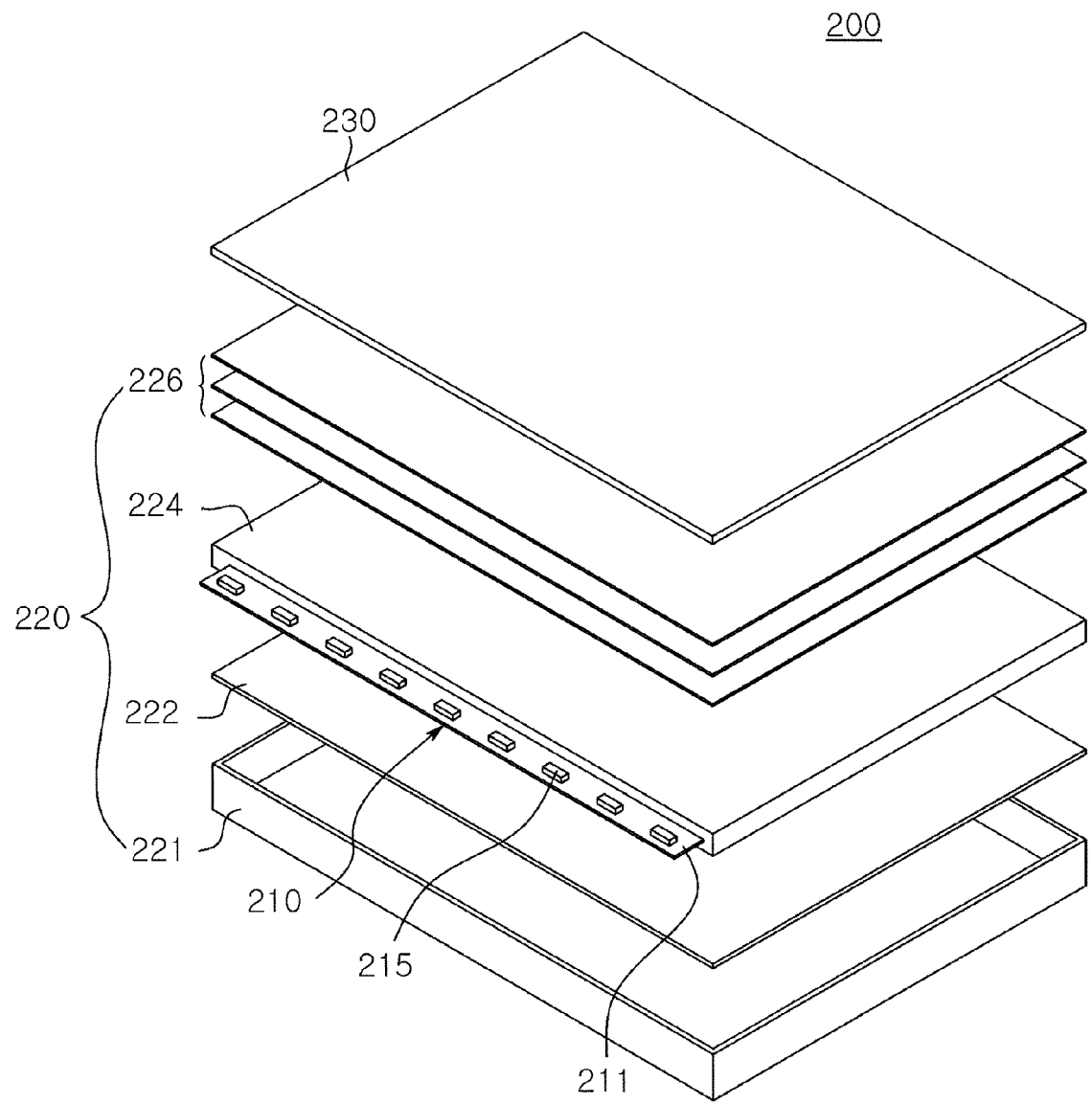
FIG. 12 is an exploded perspective view of a display apparatus according to an embodiment of the present invention.

FIG. 12 is an exploded perspective view illustrating a display apparatus according to an embodiment of the present invention.

A display apparatus 200 illustrated in FIG. 12 includes a backlight unit 220 and an image display panel 230 such as a liquid crystal panel. The backlight unit 220 includes a light guide plate 224 and an LED light source module 210 provided to at least one side of the light guide plate 224.

In the present embodiment, the backlight unit 220 may further include a bottom case 221 and a reflective plate 222 positioned on a lower portion of the light guide plate 224.

Also, various types of optical sheets 226, such as a diffusion sheet, a prism sheet, or a protection sheet, may be disposed between the light guide plate 224 and the liquid crystal panel 230 according to demand for various optical characteristics.

The LED light source module 210 may include a PCB 211 provided to at least one side of the light guide plate 224 and a plurality of LED light sources 215 mounted on the PCB 211 and emitting light to the light guide plate 224. The plurality of LED light sources 215 may be the foregoing white light emitting devices. The plurality of LED light sources 215 employed in the present embodiment may be a side view type light emitting device package in which the sides of the plurality of LED light sources are mounted to be adjacent to the light emission surface.

As described above, the foregoing phosphors can be applicable to an LED light source module applied to a white light emitting device having various mounting structures and providing various types of white light. The foregoing light emitting device package or a light source module including the same may be applicable to various types of display apparatuses or lighting apparatuses.

Figure 14:
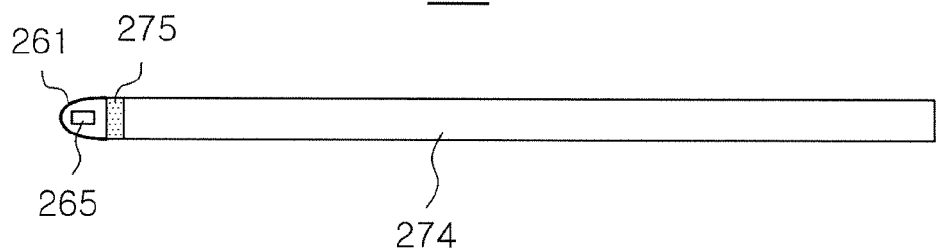
Figure 15:
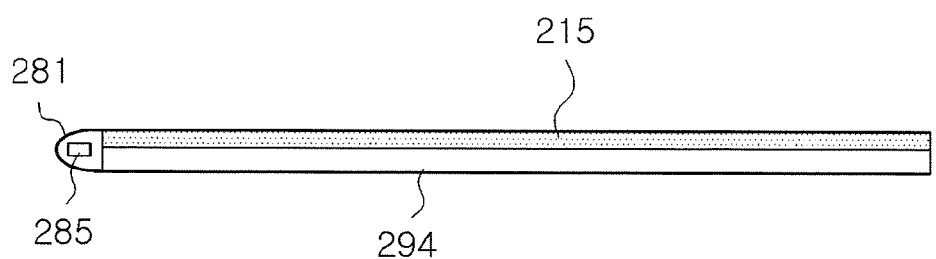

Besides the foregoing embodiments, a phosphor may be disposed on a different element, rather than being disposed on the package in which the LED is positioned, to convert light. This embodiment is illustrated in FIGS. 13 through 15.

Figure 13:
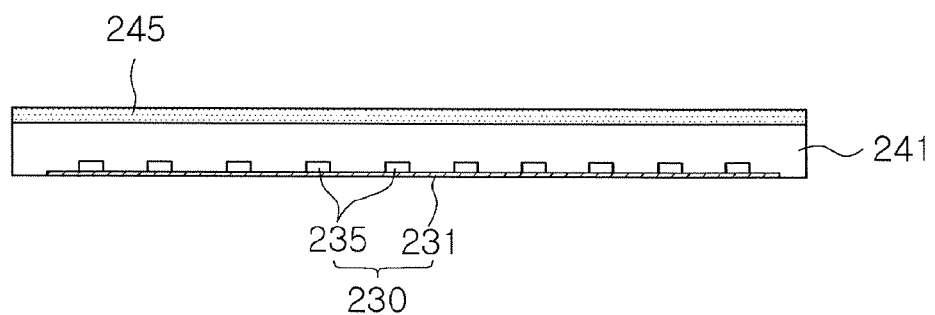
FIGS. 13 through 15 are cross-sectional views showing various types of backlight units applicable to a display apparatus according to an embodiment of the present invention.

First, as shown in FIG. 13, a direct type backlight unit 250 according to the present embodiment may include a phosphor film 245, and an LED light source module 230 arranged on a lower surface of the phosphor film 245.

The backlight unit 250 illustrated in FIG. 13 may include a bottom case 241 for accommodating the light source module 230. In the present embodiment, the phosphor film 245 is disposed on an upper surface of the bottom case 241. At least a portion of light emitted from the light source module 230 may be wavelength-converted by the phosphor film 245. The phosphor film 245 may be fabricated as a separate film, or may be provided in the form of being integrally coupled with a light diffusion plate.

Here, the LED light source module 230 may include a PCB 231 and a plurality of LED light sources 235 mounted on an upper surface of the PCB 231.

FIGS. 14 and 15 illustrate various edge type backlight units applicable to a display apparatus according to an embodiment of the present invention.

An edge type backlight unit 280 illustrated in FIG. 14 may include a light guide plate 274 and an LED light source 265 provided at one side of the light guide plate 274. Light emitted from the LED light source 265 may be guided to the interior of the light guide plate 274 by a reflection structure 261. In the present embodiment, a phosphor film 275 may be positioned between the side of the light guide plate 274 and the LED light source 265.

An edge type backlight unit 300 illustrated in FIG. 15 may include a light guide plate 294, an LED light source 285 provided to one side of the light guide plate 294, and a reflection structure 281. In the present embodiment, a phosphor film 295 is illustrated as being applied to a light emission surface of the light guide plate 294.

In this manner, the phosphor mixture according to the present embodiment can be implemented such that it is applied to a different device such as the backlight unit, or the like, rather than being directly applied to the LED light source.

An illumination apparatus according to an embodiment of the invention includes a diffusion part disposed on the upper portion of the LED light source module and uniformly diffusing light incident from the LED light source module. The LED light source module includes a PCB and at least one white light emitting device mounted on the PCB.

As set forth above, according to embodiments of the invention, two types of green phosphors together with red and yellow phosphors are applied to a blue LED so that a large FWHM, superior color reproducibility and high color rendering properties are achieved. Particularly, when a mixture of red, yellow and green phosphors is prepared, a phosphor having superior thermal stability is partially combined therewith, and accordingly, the reliability of a white light emitting device is enhanced. By adding an additional green phosphor having a relatively large FWHM, white light having improved color reproducibility and color rendering properties while having desired color coordinate characteristics can be provided.

While the present invention has been shown and described in connection with the embodiments, it will be apparent to those skilled in the art that modifications and variations can be made without departing from the spirit and scope of the invention as defined by the appended claims.

What is claimed is:
1. A white light emitting device comprising:
a blue LED emitting blue light;
a red phosphor excited by the blue light, emitting red light, and including a nitrogen (N)-containing compound;
a yellow phosphor excited by the blue light and emitting yellow light;
a first green phosphor excited by the blue light, emitting first green light having a first full width half maximum, and including a nitrogen (N)-containing compound; and
a second green phosphor excited by the blue light and emitting second green light having a second full width half maximum larger than the first full width half maximum of the first green phosphor,
wherein the blue light, the red light, the yellow light, the first green light and the second green light are combined to provide white light having a color coordinate falling within a region defined by four coordinate points (0.21, 0.21), (0.25, 0.17), (0.33, 0.30) and (0.33, 0.35) based on the CIE 1931 chromaticity diagram.

2. The white light emitting device of claim 1, wherein the first green light has a color coordinate falling within a region defined by four coordinate points (0.370, 0.590), (0.370, 0.620), (0.300, 0.690) and (0.300, 0.660) based on the CIE 1931 chromaticity diagram, and
the second green light has a color coordinate falling within a region defined by four coordinate points (0.420, 0.565), (0.420, 0.525), (0.300, 0.560) and (0.300, 0.620) based on the CIE 1931 chromaticity diagram.

3. The white light emitting device of claim 2, wherein the yellow light has a color coordinate falling within a region defined by four coordinate points (0.420, 0.580), (0.470, 0.530), (0.470, 0.500) and (0.420, 0.550) based on the CIE 1931 chromaticity diagram.

4. The white light emitting device of claim 2, wherein the red light has a color coordinate falling within a region defined by four coordinate points (0.600, 0.400), (0.670, 0.330), (0.670, 0.310) and (0.600, 0.380) based on the CIE 1931 chromaticity diagram.

5. The white light emitting device of claim 1, wherein the blue light is within a dominant wavelength ranging from 435 nm to 465 nm.

6. The white light emitting device of claim 5, wherein the first green light has a peak wavelength of 520 nm to 545 nm and the first full width half maximum of 70 nm or less, and
the second green light has a peak wavelength of 525 nm to 565 nm.

7. The white light emitting device of claim 6, wherein the red light has a peak wavelength of 600 nm to 650 nm.

8. The white light emitting device of claim 7, wherein the yellow light has a peak wavelength of 550 nm to 580 nm larger than the peak wavelength of the second green light.

9. The white light emitting device of claim 8, wherein a light emission spectrum of the white light has an emission peak outside of a blue light wavelength band, and
the emission peak has a full width half maximum of 90 nm or larger.

10. The white light emitting device of claim 1, wherein the first green phosphor includes β-SiAlON:Eu, and
the second green phosphor includes $L_3M_5O_{12}$:Ce, where L is at least one of Lu, Yb and Tb and M is at least one of Al and Ga.

11. The white light emitting device of claim 10, wherein the red phosphor is at least one of $AAlSiN_x$:Eu ($1 \leq x \leq 5$) and $A_2Si_5N_8$:Eu, where A is at least one of Ba, Sr, Ca and Mg.

12. The white light emitting device of claim 11, wherein the yellow phosphor is at least one of $ASiO_4$:Eu and $A_2Si_2O_2N_2$:Eu, where A is at least one of Ba, Sr, Ca and Mg.

13. The white light emitting device of claim 1, wherein the white light represents a color reproducibility of 69% or greater based on the NTSC standard.

14. A display apparatus comprising:
an LED light source module; and
an image display panel allowing for irradiation of light from the LED light source module and displaying an image,
wherein the LED light source module includes a circuit board and at least one white light emitting device of claim 1 mounted on the circuit board.

15. An illumination apparatus comprising:
an LED light source module; and
a diffusion part disposed on an upper portion of the LED light source module and uniformly diffusing light incident from the LED light source module,
wherein the LED light source module includes a circuit board and at least one white light emitting device of claim 1 mounted on the circuit board.

16. A white light emitting device comprising:
a blue LED emitting blue light having a dominant wavelength ranging from 435 nm to 465 nm;
a red phosphor excited by the blue light and emitting red light having a peak wavelength of 600 nm to 650 nm;
a yellow phosphor excited by the blue light and emitting yellow light having a peak wavelength of 550 nm to 580 nm;
a first green phosphor excited by the blue light, emitting first green light having a first peak wavelength of 520 nm to 545 nm and a first full width half maximum of 70 nm or less; and
a second green phosphor excited by the blue light and emitting second green light having a second peak wavelength of 525 nm to 565 nm and a second full width half maximum larger than the first full width half maximum,
wherein the blue light, the red light, the yellow light, the first green light and the second green light are combined to provide white light having a color coordinate falling within a region defined by four coordinate points (0.21, 0.21), (0.25, 0.17), (0.33, 0.30) and (0.33, 0.35) based on the CIE 1931 chromaticity diagram.

17. The white light emitting device of claim 16, wherein a light emission spectrum of the white light has an emission peak outside of a blue light wavelength band, and
the emission peak has a full width half maximum of 90 nm or larger.

18. The white light emitting device of claim 16, wherein the first green phosphor includes β-SiAlON:Eu, and
the second green phosphor includes $L_3M_5O_{12}$:Ce, where L is at least one of Lu, Yb and Tb and M is at least one of Al and Ga.

19. The white light emitting device of claim 18, wherein the red phosphor is at least one of $AAlSiN_x$:Eu ($1 \leq x \leq 5$) and $A_2Si_5N_8$:Eu, where A is at least one of Ba, Sr, Ca and Mg.

20. The white light emitting device of claim 19, wherein the yellow phosphor is at least one of $ASiO_4$:Eu and $A Si_2O_2N_2$:Eu, where A is at least one of Ba, Sr, Ca and Mg.

21. A phosphor mixture having a plurality of phosphors excited by blue light having a dominant wavelength ranging from 435 nm to 465 nm, the phosphor mixture comprising:
a red phosphor excited by the blue light, emitting red light, and including a nitride;
a yellow phosphor excited by the blue light and emitting yellow light;
a first green phosphor excited by the blue light, emitting first green light having a first full width half maximum, and including a nitride; and
a second green phosphor excited by the blue light and emitting second green light having a second full width half maximum larger than the first full width half maximum,
wherein the blue light, the red light, the yellow light, the first green light and the second green light are combined to provide white light having a color coordinate falling within a region defined by four coordinate points (0.21, 0.21), (0.25, 0.17), (0.33, 0.30) and (0.33, 0.35) based on the CIE 1931 chromaticity diagram.

22. A display apparatus including the phosphor mixture of claim 21.

23. An illumination apparatus including the phosphor mixture of claim 21.

* * * * *